United States Patent [19]

Cloutier et al.

[11] 4,427,943

[45] Jan. 24, 1984

[54] APPARATUS AND METHOD FOR LOCATING AND TRACKING MAGNETIC OBJECTS OR SOURCES

[75] Inventors: Paul A. Cloutier; Delbert R. Oehme; Ronald F. Stebbings, all of Houston, Tex.

[73] Assignee: Innovatum, Inc., Houston, Tex.

[21] Appl. No.: 436,815

[22] Filed: Oct. 26, 1982

Related U.S. Application Data

[63] Continuation-in-part of Ser. No. 290,670, Aug. 5, 1981, abandoned, which is a continuation of Ser. No. 13,291, Feb. 21, 1979, abandoned.

[51] Int. Cl.³ .............................................. G01V 3/08
[52] U.S. Cl. .................................. 324/326; 324/243; 324/301; 324/345
[58] Field of Search ............... 324/301, 302, 243, 244, 324/246, 247, 326, 345, 67, 260

[56] References Cited

U.S. PATENT DOCUMENTS

| | | |
|---|---|---|
| 2,485,847 | 10/1949 | Schmitt . |
| 2,852,859 | 9/1958 | Depp . |
| 2,856,579 | 10/1958 | Packard ........................ 324/301 |
| 2,887,872 | 5/1959 | Halpern . |
| 2,966,853 | 1/1961 | Gilfillan . |
| 3,159,785 | 12/1964 | Beynon . |
| 3,488,579 | 1/1970 | Schonstedt . |
| 3,490,032 | 1/1970 | Zurflueh . |
| 3,573,610 | 4/1971 | Kesselring . |
| 3,617,865 | 11/1972 | Hakata . |
| 3,644,825 | 2/1972 | Davis, Jr. ........................ 324/345 |
| 3,808,519 | 4/1974 | Lemercier . |
| 3,826,973 | 7/1974 | Pflaum .......................... 324/243 |
| 3,829,768 | 8/1974 | Nicol . |
| 3,971,983 | 7/1976 | Jacquet . |

FOREIGN PATENT DOCUMENTS 1202534 8/1970 United Kingdom .

OTHER PUBLICATIONS

IEEE Transactions on Magnetics, vol. MAG-11, No. 2 Mar. 1975, pp. 701–707.
The Review of Scientific Instruments vol. 32, No. 4, pp. 444–448.
Institution of Electrical Engineers, London vol. 93, Pt. 1 #70 Oct. 1946, pp. 435–446.

*Primary Examiner*—Michael J. Tokar
*Attorney, Agent, or Firm*—Shapiro and Shapiro

[57] ABSTRACT

At least one pair of vector gradiometers is employed to locate (and track) magnetic objects or sources. A first signal, S, is produced as a function of the difference in the absolute values of output signals L and R from left and right gradiometers, respectively. The form of the signal depends upon whether the magnetic field associated with the object or source is symmetric or anti-symmetric and is selected in accordance with observations made as the gradiometer pair passes over the magnetic object or source. A second signal, V, is produced as a function of the sum of the absolute values of signals L and R and represents total strength. A third signal, H=S/V, is produced to determine whether the observer is to the left or to the right of the magnetic object or source and is independent of the magnetic field strength and polarity of the magnetic field, even where the polarity and magnetic field strength vary with distance along a linear source. Compensation is employed for gradiometer sensor misalignment and temperature variations, and extraneous magnetic fields are nulled.

36 Claims, 14 Drawing Figures

APPARATUS AND METHOD FOR LOCATING AND TRACKING MAGNETIC OBJECTS OR SOURCES

This application is a continuation-in-part of Application Ser. No. 290,670, filed Aug. 5, 1981, abandoned which is a continuation of Application Ser. No. 13,291, filed Feb. 21, 1979, now abandoned.

BACKGROUND OF THE INVENTION

This invention relates to apparatus and methods for locating magnetic objects or sources. The term "locating" as used hereinafter is intended to include the tracking of magnetic objects. The term "magnetic objects" as used hereinafter is intended to include bodies or sources that have an intrinsic magnetic field, as well as objects that produce a detectable perturbation in an extrinsic magnetic field, such as the earth's magnetic field.

The prior art is replete with apparatus for locating magnetic objects such as surveyor's benchmarks, underground utility lines, and buried artifacts. Both active locating apparatus, which generates a magnetic field and senses modification of the field by the object to be detected, and passive locating apparatus, which merely senses a magnetic field associated with the object, are well known. Apparatus of the latter type includes vector gradiometers which sense the magnetic field gradient. Because of the many possible combinations of sources, orientations, polarity, and strength of magnetic fields associated with physical objects, unique determination of the position of a magnetic object without prior knowledge of the magnetic properties of the object has been difficult.

BRIEF DESCRIPTION OF THE INVENTION

It is accordingly a principal object of the present invention to provide improved apparatus and methods of locating magnetic objects.

A further object of the invention is to provide apparatus and method which produce directional information useful for locating magnetic objects without the need for prior knowledge of object characteristics.

Another object of the invention is to provide an apparatus of the foregoing type with improved temperature compensation over a wide range.

Still another object of the invention is to provide an apparatus of the foregoing type having improved ability to null external magnetic fields.

Another object of the invention is to provide apparatus of the foregoing type that offers simultaneous visual display of the horizontal displacement of the apparatus from a magnetic object and of the magnetic field strength.

Still another object of the invention is to provide apparatus capable of precisely tracking a subterranean or underwater pipe or cable, for example, and capable of providing information related to welds, joints, valves, unions, breaks, and other discrete physical features along the pipe or cable being tracked.

An additional object of the invention is to provide an improved apparatus and method for locating magnetic objects within pipes.

A further object of the invention is to provide an apparatus of the foregoing type which stores and recalls directional information in the event that locating signals are interrupted or lost.

An additional object of the invention is to provide an improved apparatus and method of locating magnetic objects in which horizontal and vertical information as to the location of the object is produced.

Briefly stated, in accordance with one of the broader aspects of the invention, a pair of vector gradiometers is employed to locate magnetic objects. Means responsive to the output signals from the gradiometers indicates the position of a magnetic object relative to the gradiometers along a coordinate axis irrespective of the magnetic field signature of the object. In a preferred embodiment, a first signal, S, is produced as a function of the difference in the absolute values of signals L and R from left and right gradiometers, respectively. The form of the signal depends upon whether the magnetic field associated with the object or source is symmetric or anti-symmetric and is selected in accordance with observations made as the gradiometer pair passes over the magnetic object or source. A second signal, V, is produced as a function of the sum of the absolute values of signals L and R and represents total signal strength. A third signal, $H=S/V$, is produced to determine whether the observer is to the left or to the right of the magnetic object or source and is independent of the magnetic field strength and polarity of the magnetic field, even where the polarity and magnetic field strength vary with distance along a linear source. Compensation is employed for gradiometer sensor misalignment and temperature variations, and extraneous magnetic fields are nulled.

BRIEF DESCRIPTION OF THE DRAWINGS

The invention will be further described in conjunction with the accompanying drawings, which illustrate preferred and exemplary embodiments, and wherein.

DETAILED DESCRIPTION OF PREFERRED EMBODIMENTS

Figure 1:
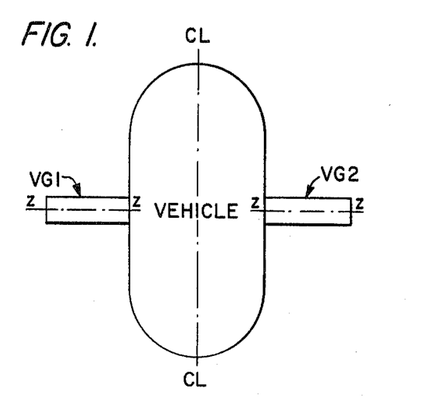
FIG. 1 is a diagrammatic plan view of a first embodiment of the invention.
Figure 3:
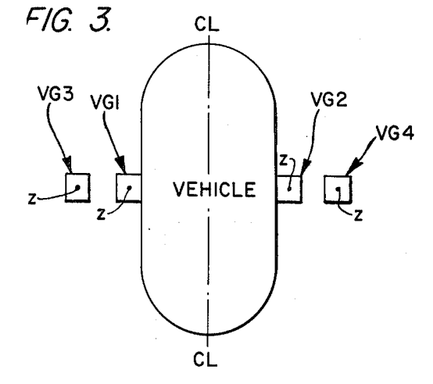
FIG. 3 is a similar view of a third embodiment.
Figure 5:
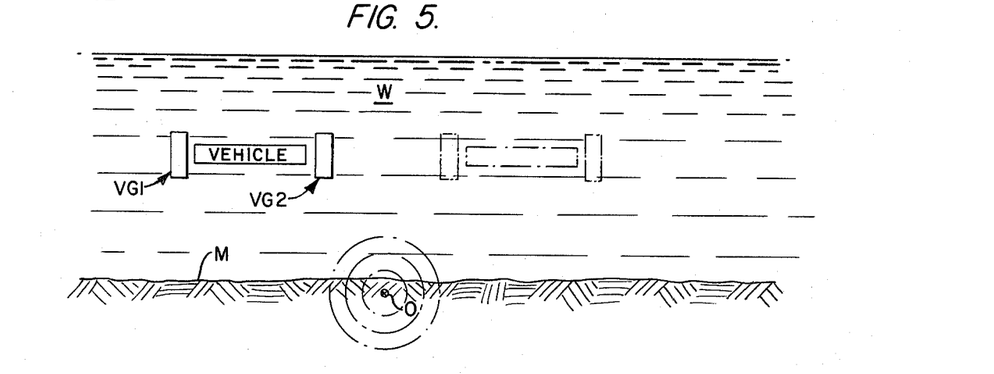
FIG. 5 is a diagrammatic elevation view illustrating the utilization of the invention.

As shown in FIG. 1, a first embodiment of the invention may comprise a pair of vector gradiometers VG1 and VG2 mounted on a vehicle (so-designated) with their principal magnetic sensing axes z—z (hereinafter referred to simply as the magnetic axes of the gradiometers) perpendicular to the longitudinal center line CL of the vehicle at opposites sides thereof. The magnetic axes of the gradiometers are parallel (this term is intended to include collinear) and may lie along the transverse horizontal axis of the vehicle, for example. As shown in FIGS. 3 and 5, other arrangements of the magnetic axes, such as vertical orientation, may be employed. The vector gradiometers, which may be mounted on a non-magnetic frame, for example, will be described in greater detail later. It suffices to state here that if the gradiometers are supported on the vehicle at spaced locations so that they measure the magnetic gradient at two horizontally spaced locations, the horizontal displacement of the vehicle from a magnetic object can be determined. The vehicle may be a land vehicle, including trailers and sleds, for example; a water-craft, such as a boat or a raft, including surface and subsurface vessels, manned and unmanned vessels, towed bodies, hydrofoils, and bottom-contact sleds, for example; an aircraft, such as fixed and rotary-winged craft, hovercraft, towed airfoils, kites, and balloons, for example; or even pedestrians or swimmers (surface or underwater). The invention may be employed for the location of point magnetic objects, such as buried or submerged artifacts, mines, weapons, shipwrecks, etc., and for the tracking of linear magnetic objects such as cables, lines, pipes, tubes, chains, wires, etc.

The embodiment of FIG. 1 is a 2-gradiometer configuration in which two vector gradiometers with horizontal magnetic axes are horizontally displaced symmetrically to the right and left of the vehicle center line. Each gradiometer separately measures the difference in a horizontal field component at two horizontally displaced regions. If the gradiometers were turned to place their magnetic axes in a vertical plane, as shown in FIGS. 3 and 5, each would measure the difference in a vertical field component at two vertically displaced regions.

Assuming for purposes of illustration that the gradiometers are mounted as shown in FIG. 1, they will produce corresponding output signals L and R, which are employed, as described later, to produce a signal V providing a measure of total signal strength, and to produce a signal H representative of horizontal displacement of the vehicle from a magnetic object. Location of point objects may be achieved by moving the vehicle relative to the object so as to minimize H and maximize V. Tracking of objects having extended length (referred to herein as linear objects) may be achieved by moving the vehicle so as to minimize H while moving along the object. Location of features along a linear object being tracked may be achieved by observing variations in V.

Figure 2:
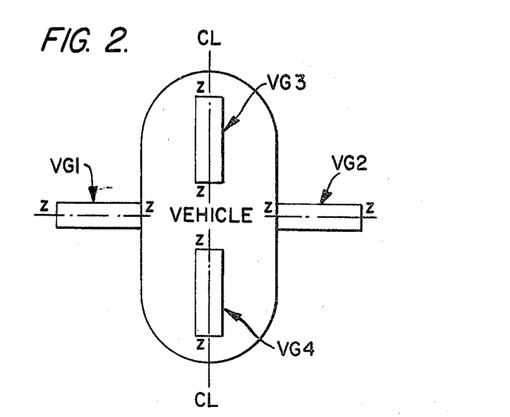
FIG. 2 is a similar view of a second embodiment.

The embodiment of FIG. 2 employs two pairs of vector gradiometers VG1, VG2 and VG3, VG4, with one pair arranged left and right, and the other pair arranged fore and aft on the vehicle. The gradiometers of each pair have parallel magnetic axes z—z, and the magnetic axes of one pair are orthogonal to the magnetic axes of the other pair. The resultant output signals from the gradiometers provide information as to the position of a magnetic object in terms of two vector displacement components in a horizontal plane. This embodiment may be employed to locate point objects in horizontal coordinates, to track moving point objects, such as submergible objects or magnetized bodies in pipes, by minimizing both H-fore-aft and H-left-right, or to locate magnetic anomalies (such as welds, joints, valves, intersections, breaks, etc.) along pipes and cables, for example. Again, the magnetic axes may be arranged differently; for example they may be oriented vertically.

Figure 4:
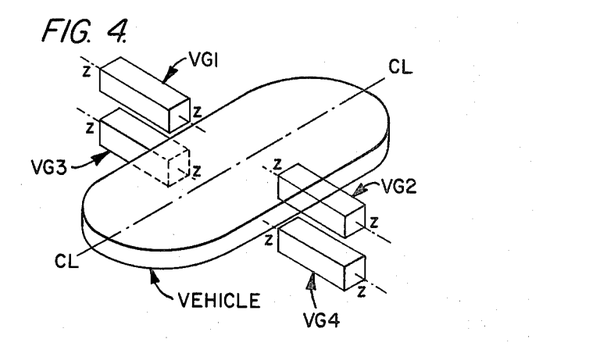
FIG. 4 is a diagrammatic isometric view of a fourth embodiment.

The embodiment of FIG. 3 is a 4-gradiometer configuration in which a second pair of gradiometers VG3, VG4 is arranged outboard of the gradiometers VG1, VG2 of the first pair, so that the first pair is nested within the second pair and so that all of the gradiometers are arranged along a horizontal line with their magnetic axes z—z parallel. Although the magnetic axes are shown vertical, they may be arranged horizontal along the same horizontal line, for example. A ratio of $V_{outer}/V_{inner}$ may be formed, which varies with height above an object being tracked and thus provides vertical displacement information or depth. Similarly, vertical displacement information may be obtained in the embodiment of FIG. 4, where the second pair of gradiometers VG3, VG4 is vertically displaced from corresponding gradiometers VG1 and VG2 of the first pair, with the magnetic axes z—z of all of the gradiometers parallel. Although the magnetic axes are shown horizontal, they may be vertical, for example, with VG1 and VG3 having collinear vertical magnetic axes and VG2 and VG4 having collinear vertical magnetic axes. In this embodiment the ratio of $V_{upper}/V_{lower}$ may be formed to provide vertical displacement information. The embodiments of FIGS. 3 and 4 may be used to locate point objects or linear objects in the vertical dimension and/or to determine vertical displacement from the vehicle of linear objects being tracked. Vertical displacement information, which is a function of the ratio of the gradiometer V signals, may, if desired, be displayed only when signal H is quite small, say $|H| \leq 0.15$. In the embodiments of FIGS. 1, 2 and 4, all the magnetic axes may be turned 90° in a horizontal plane, but the orientations shown are preferred.

Figure 6A:
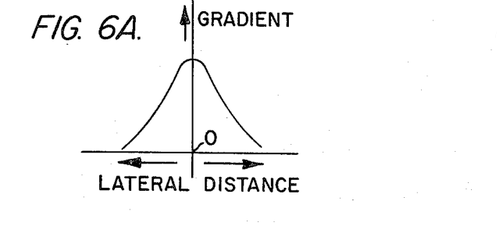
FIGS. 6A and 6B are graphical diagrams illustrating symmetric and anti-symmetric magnetic field gradients associated with magnetic objects.

All magnetic objects, regardless of the physical properties responsible for their magnetic field, produce magnetic fields which are either predominantly spatially symmetric or spatially anti-symmetric about the object position as measured along a line which crosses the object position. The gradient in any vector component of the magnetic field associated with the magnetic object is also predominantly symmetric or anti-symmetric. FIG. 6A is a curve showing the variation of magnetic field gradient when the gradient is symmetric and FIG. 6B when the gradient is anti-symmetric. In each instance the ordinate represents the gradient magnitude and the abscissa represents lateral distance (left or right) from the magnetic object O.

Figure 6B:
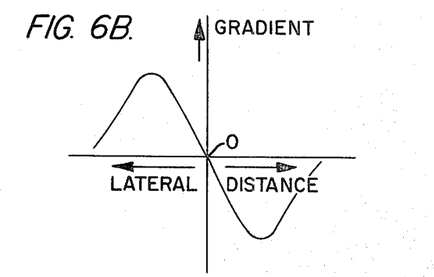

The present invention utilizes the foregoing characteristics of magnetic objects. FIG. 5 illustrates the utilization of the invention in locating a magnetic object O buried beneath the mudline M of a body of water W. The vehicle (so-designated) carrying the gradiometers VG1 and VG2 may be a submersible, for example, with the gradiometers arranged vertically at opposite sides of the vehicle. If the vehicle is moved from the solid line position to the phantom line position and the magnetic object O has a symmetric field, the gradiometers VG1 and VG2 will sense a magnetic field gradient which varies as shown in FIG. 6A, with a single maximum immediately above the object O. If the magnetic field associated with the object is anti-symmetric, the gradiometers will sense a magnetic field gradient which varies as shown in FIG. 6B, with a minimum immediately above the object O and maxima at opposite sides of the object.

Figures 7, 7A:
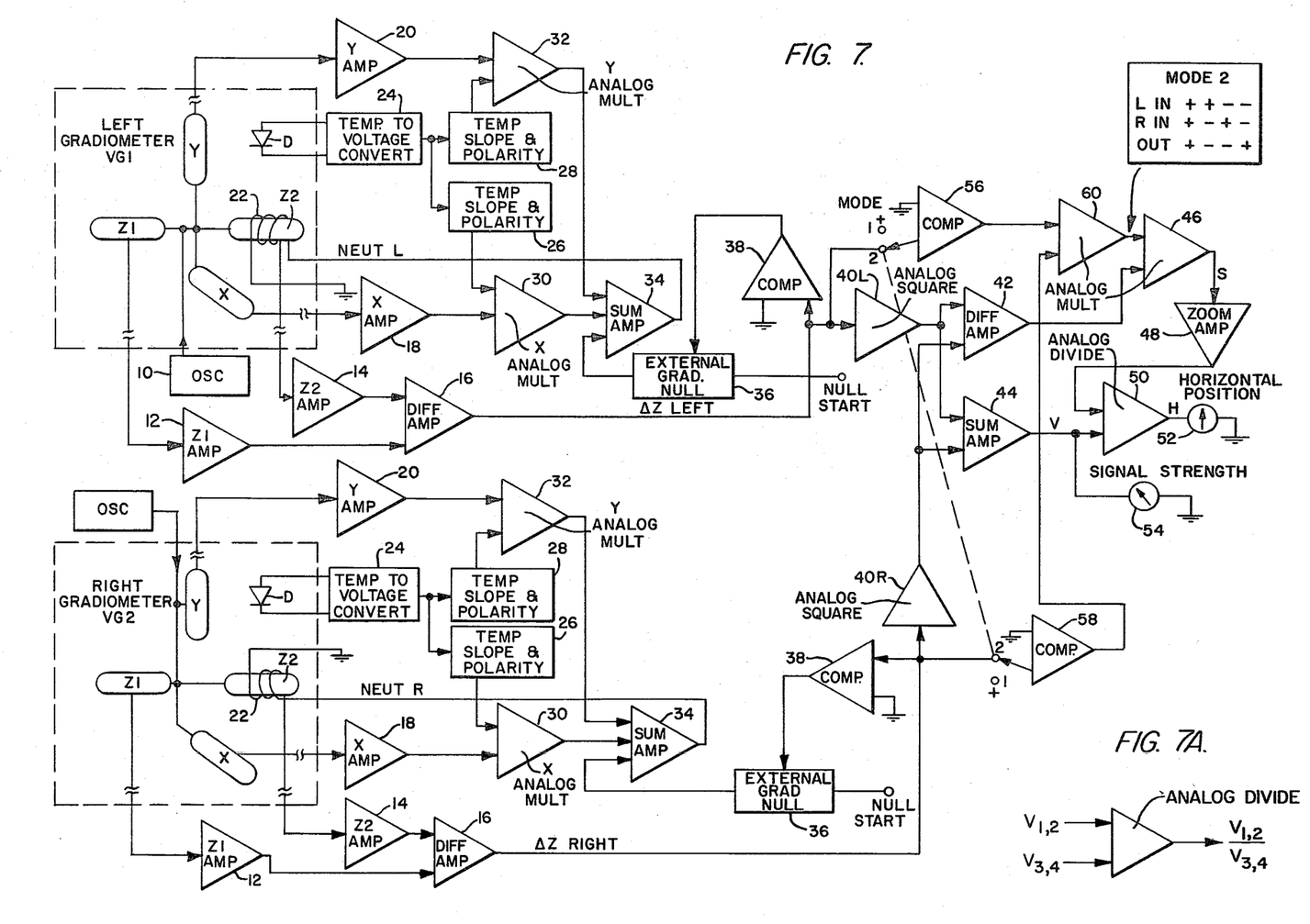
FIG. 7 is a block diagram illustrating an electrical system associated with a pair of vector gradiometers in accordance with the invention.
FIG. 7A is a block diagram of a modification.

FIG. 7 is a block diagram of an electrical system which may be employed, in accordance with the invention, with vector gradiometers VG1 and VG2 of FIG. 1 or 5, for example, and which produces the signals S, V, and H. A similar system may be employed for each pair of gradiometers in each of the embodiments. A basic type of vector gradiometer appropriate for use in the present invention is described, for example, in U.S. Pat. No. 3,488,579 issued Jan. 6, 1970 to Schonstedt. Since most of the system of FIG. 7 is duplicated for the gradiometers VG1 and VG2, a description with respect to one gradiometer will suffice for both.

Each gradiometer may comprise a pair of magnetic sensors Z1 and Z2 of the fluxgate type, as disclosed, for example, in U.S. Pat. No. 2,981,885, issued Apr. 25, 1961 to Schonstedt, or any other appropriate type. The details of the sensors are not part of the present invention, but for illustrative purposes it may be assumed that each sensor has a tubular core of permeable magnetic material with an excitation conductor extending longitudinally through the core and a signal pick-up winding wound circumferentially around a cylindrical non-magnetic housing surrounding the core. The excitation conductors are supplied with alternating current by an oscillator 10. Second harmonic fluxes generated in the cores due to the effect of an external non-uniform magnetic field acting along the core axes cut the pick-up windings and generate second harmonic fluxes therein. The output voltages in the pick-up windings of sensors Z1 and Z2, after conventional synchronous demodulation and rectification (not shown to avoid unnecessary complication of the drawings) are amplified in amplifiers 12 and 14. The outputs of amplifiers 12 and 14 are then supplied as inputs to a differential amplifier 16. If sensors Z1 and Z2 are matched and their individual z—z axes are perfectly aligned, the output of the differential amplifier 16 will be zero when the gradiometer is in a uniform field. If a magnetic object exists within the detection range of the gradiometer, the magnetic field will generally be stronger at one of the sensors than at the other sensor. As a result, the output signal of one sensor will be greater than that of the other, so a net difference signal will be produced that is indicative of the presence of the object.

For accuracy of operation, the magnetic axes of the sensors Z1 and Z2 of each gradiometer must be precisely aligned, i.e., parallel or collinear. If the magnetic axes of the two sensors are not precisely aligned, the component of an ambient uniform magnetic field existing along the magnetic axis of one sensor will not be the same as the component of the magnetic field existing along the magnetic axis of the other sensor. The difference between the two sensor signals will not be zero, and a false output signal will be produced due to this mechanical misalignment.

As described in Schonstedt U.S. Pat. No. 3,488,579, compensation for misalignment of the axes of the magnetic sensors can be achieved electrically by the use of additional magnetic sensors, designated X and Y in FIG. 7 of the present drawings. All of the sensors may be of the same fluxgate type referred to above, for example. The magnetic axes of sensors X and Y are as nearly perpendicular to each other and to axis z—z as practical. Oscillator 10 excites sensors X and Y in the same manner as sensors Z1 and Z2, and output voltages from sensors X and Y are produced in their signal pick-up windings in proportion to the intensity of magnetic field components acting along their magnetic axes, respectively. These signals, after conventional synchronous demodulation and rectification (not shown to avoid unnecessary complication of the drawings) are amplified in amplifiers 18 and 20 and ultimately produce a feedback signal to a neutralizing winding 22 coupled to one of the sensors Z1, Z2 (Z2 in the case illustrated), so as to apply a magnetic field to that sensor which compensates for the misalignment of the magnetic axes of sensors Z1 and Z2. The compensating field may be determined and adjusted as set forth in the aforesaid Schonstedt Pat. No. 3,488,579.

Geometrically and electrically aligned vector gradiometers of the type described in Schonstedt Pat. No. 3,488,579 may be subject to significant alignment changes due to temperature variations, causing error signals when sensor orientation in a uniform ambient field is changed. This problem has been solved in the present invention by recognition of the following factors:

(a) The total angular misalignment of the two Z sensor axes varies with temperature in a repeatable manner (i.e., the total angular misalignment at a given temperature is a constant over repeated cyclic temperature variations).

(b) The total angular misalignment of the two Z sensor axes may be separated into two orthogonal components of misalignment, each separately proportional to the temperature variation about a fixed (zero point) temperature. Zero point temperatures of the two components are not, in general, the same.

(c) The proportional feedback of the two orthogonal misalignment compensating sensors described in Schonstedt Pat. No. 3,488,579 for electrical alignment at a fixed temperature may be corrected, as described hereinafter, to provide correct alignment at all temperatures within a chosen range. The corrections to the feedback signals employed in U.S. Pat. No. 3,488,579 consist of the algebraic addition to those signals of feedback voltages $V_T(x)$, $V_T(y)$ of the form:

$$V_T(x) = k_x T + V_O(x)$$

$$V_T(y) = k_y T + V_O(y)$$

where $V_O(x)$, $V_O(y)$ are the correction signals required at T=0° C. to the X and Y sensor feedback voltages, T is the temperature of the sensors, and $k_x$ and $k_y$ are separate constants of proportionality of the x and y axis misalignment variation with temperature. $k_x$, and $k_y$, $V_O(x)$, and $V_O(y)$ are determined experimentally for each X and Y sensor by rotating the sensors in a constant uniform magnetic field at each of several temperatures. The algebraic sum of the original alignment feedback voltage and the correction voltage is then used in place of the original feedback voltage to achieve electrical alignment at all temperatures.

As shown in FIG. 7, a silicon diode D or other appropriate device, such as a thermistor, used as a temperature sensor is contained in each gradiometer sensor package, so that its temperature is approximately the same as the fluxgate sensors. Diode D is connected to a temperature to voltage converter 24, the output of which is connected to temperature slope and polarity circuits 26 and 28. The outputs of these circuits are connected, respectively, as inputs to X and Y multipliers 30 and 32 for multiplication with the outputs of amplifiers 18 and 20 (previously described). The output of multipliers 30 and 32 are supplied as inputs to a summing amplifier 34, the output of which ultimately controls the compensating winding 22, as previously described.

Figure 8:
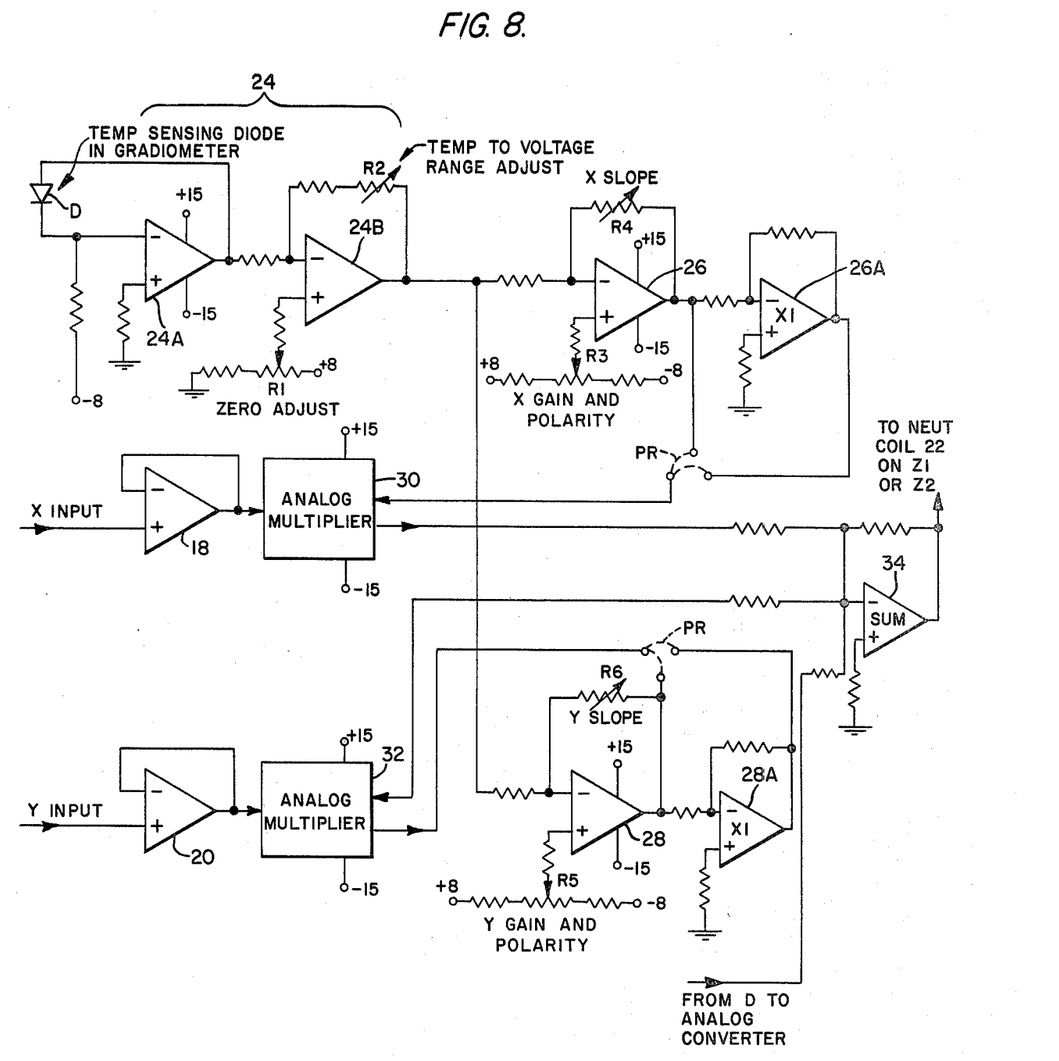
FIG. 8 is a schematic diagram illustrating details of temperature and misalignment compensation which may be employed in the system of FIG. 7.

FIG. 8 illustrates the temperature and misalignment compensation circuit in greater detail. Diode voltage variations with temperature (which are substantially linear but could include a second order term) are amplified by amplifiers 24A and 24B. Resistors R1 and R2 are adjusted to set the output of amplifier 24B from 0 to 5 volts, for example, over the sensor package temperature range of 0° C. to 50° C., for example. The output of amplifier 24B, now a voltage proportional to sensor temperature, is supplied to amplifiers 26 and 28. These amplifiers have adjustable resistances R3, R4, R5, and R6 to set individually the amount and DC level of temperature voltage variation used to compensate x and y axis sensors. A polarity reversal, if required, is available in amplifiers 26A and 28A, as indicated by the dashed-line jumper connections PR. These adjustments are made during sensor temperature calibration.

Figure 9:
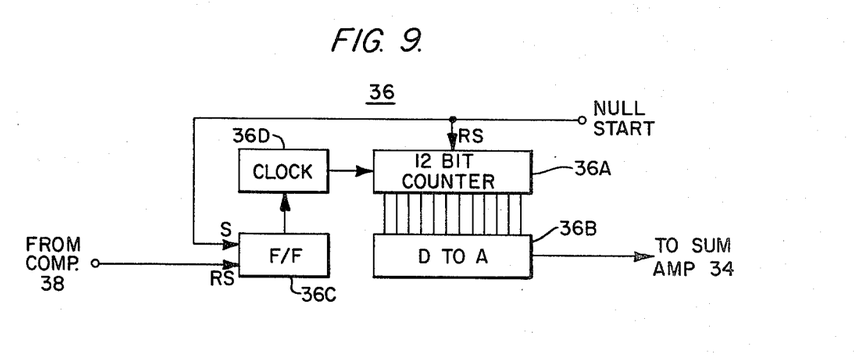
FIG. 9 is a block diagram illustrating details of an external gradient nulling circuit which may be employed in the system of FIG. 7.

It is also desired to null interfering magnetic field gradients, such as field gradients due to the vehicle itself. For this purpose, it will be observed that each summing amplifier 34 in FIG. 7 has an input from an external gradient nulling circuit 36. As shown in FIG. 9, this circuit may include a 12-bit digital counter 36A, a digital to analog converter 36B, a flip-flop 36C and a clock 36D. A null start command sets flip-flop 36C and resets counter 36A. The setting of flip-flop 36C causes clock 36D to supply pulses to the 12-bit counter 36A. The analog output of the digital to analog converter 36B, corresponding to the digital count of counter 36A, is supplied as an input to the summing amplifier 34, which supplies a compensating voltage to compensating winding 22. The ΔZ output from differential amplifier 16 (FIG. 7) is compared in comparator 38 with zero volts, and when the output of the comparator is zero (as determined by a zero crossing detector, for example) the comparator 38 supplies a reset signal to the flip-flop 36C, terminating the application of clock pulses to the 12-bit counter 36A. The analog output of digital to analog converter 36B is then a voltage which cancels the effect of unequal magnetic pick-ups on sensors Z1 and Z2. This voltage is held until a further null start command is received (whenever the operator desires to change the correction for external fields), and the foregoing process of successive approximation is repeated to null external magnetic gradients.

In accordance with the invention, a signal S containing information indicating whether a magnetic object is located on the right or left side of a gradiometer pair may be produced from the output signals L, R of the two vector gradiometers VG1 and VG2 located symmetrically on the left side and the right side of the vehicle, as shown in FIGS. 1-5. Selection of the form of the signal produced depends on whether the external gradient is symmetric or anti-symmetric, and has two modes:

$$S = |L|^n - |R|^n \quad \text{(i) (symmetric gradient)}$$

$$S = \text{sign}(L)\,\text{sign}(R)\,[|L|^n - |R|^n] \quad \text{(ii) (anti-symmetric)}$$

where the terms $|L|$, $|R|$ connote absolute values (magnitude) of the two gradiometer signals and $n \geq 0$, not necessarily an integer. The value of n may be selected to provide variations in tracking sensitivity and horizontal range of proportional displacement signals. The signal S will be either positive or negative depending on whether the magnetic object is located to the left or right of the pair of gradiometers. Selection of the form of S is discussed later.

The magnitude of the signal S will vary with height of the gradiometers above the magnetic object, strength of the field associated with the object, and horizontal displacement from the object. However, a signal H may be formed from S which is independent of the strength of the field associated with the object, and which is roughly linearly proportional to the ratio of horizontal displacement (x) to vertical displacement (z) of the object relative to the gradiometer pair over a defined range of horizontal displacement.

The signal H is related to the signal S by the equation:

$$H = S/V$$

where $V = |L|^n + |R|^n$. Signal V provides a measure of total signal strength from both gradiometers. The signal H has the following characteristics:

(1) H is nearly linearly proportional to the horizontal displacement x of the object from the observer (gradiometer pair) for $x \geq z$ (the vertical displacement).

(2) H is nearly constant and approaches a value of unity for $x \gg z$.

(3) Sign of H indicates whether the object is located to the right or left of the observer (vehicle).

(4) H is independent of the magnetic field strength or polarity of the field provided the field is above the noise level for both gradiometers.

(5) H correctly indicates horizontal displacement of the object from the observer even though the polarity and magnetic field strength may vary in tracking a linear object.

The form of the signal S corresponding to symmetric gradient or anti-symmetric gradient is chosen by observing whether V has a single maximum or dual maxima as a gradiometer pair passes over a magnetic object. Additional information on the selection of the mode for S is provided by the correlation of changes in H with the observer's motion. The choice of the mode of S is correct if movement of the observer in the direction indicated by H results in decrease in H (for small H). Otherwise, the mode used is incorrect and the other mode should be selected.

A device may be constructed in accordance with the invention to provide simultaneous visual display of horizontal displacement of a magnetic object and magnetic field strength. The display may comprise a vertically oriented strength indicator (meter) and a horizontally oriented horizontal displacement indicator (meter). The signal strength indicator provides a visual analog or digital display of V, with increasing display value (deflection) for increasing V. The horizontal displacement indicator provides a visual display of the direction and magnitude H of the horizontal displacement of the magnetic object from the observer, with exact center corresponding to zero horizontal displacement and full scale deflections left or right corresponding normally to horizontal displacement greater than or equal to the vertical distance (depth or altitude) between the gradiometers and the magnetic object.

A linear magnetic object, such as a pipe or cable may be tracked by maintaining a course along which the horizontal displacement indicator remains exactly centered (H=0). A continuous chart record of the vertical display (magnetic signal strength indicator) provides a graphic display of magnetic strength variations along a linear object being tracked and provides information related to welds, breaks, joints, valves, unions, and other discrete physical features along a pipe or cable, for example, being tracked. The invention may also be used to locate magnetized objects within continuous pipes.

FIG. 7 illustrates, generally, the manner in which signals S, V, and H can be produced. In the example illustrated, n=2. The $\Delta Z$ left output is supplied to an analog squaring circuit 40L, and the $\Delta Z$ right output is supplied to an analog squaring circuit 40R. The outputs of the squaring circuits are supplied to a differential amplifier 42 and a summing amplifier 44. The output of differential amplifier 42 is supplied to an analog multiplier 46, the output of which, signal S (as explained in a moment) is supplied through a zoom amplifier 48 to an analog divider 50, where signal S is divided by signal V, the output of summing amplifier 44. The output of divider 50, signal H, is indicated on meter 52, while signal V is indicated on meter 54.

To produce signal S, the $\Delta Z$ left and $\Delta Z$ right outputs are supplied to comparators 56, and 58, respectively, where, in mode 2 (anti-symmetric) these signals are compared with 0 volts to determine their polarity. The outputs of comparators 56 and 58 in mode 2 are signals of predetermined magnitude and have polarity dependent upon the polarity of the $\Delta Z$ left and $\Delta Z$ right signals, respectively. The comparator outputs are multiplied in an analog multiplier 60, producing a signal of predetermined magnitude having a polarity dependent upon the polarities of the inputs to multiplier 60 (as shown by the adjacent chart). The output of multiplier 60 is multiplied in analog multiplier 46 with the output of differential amplifier 42, which is $|L|^2-|R|^2$. The generation and display of signals S, V and H is illustrated in greater detail in FIG. 10, along with other aspects of the invention, which will now be described.

Figure 10:
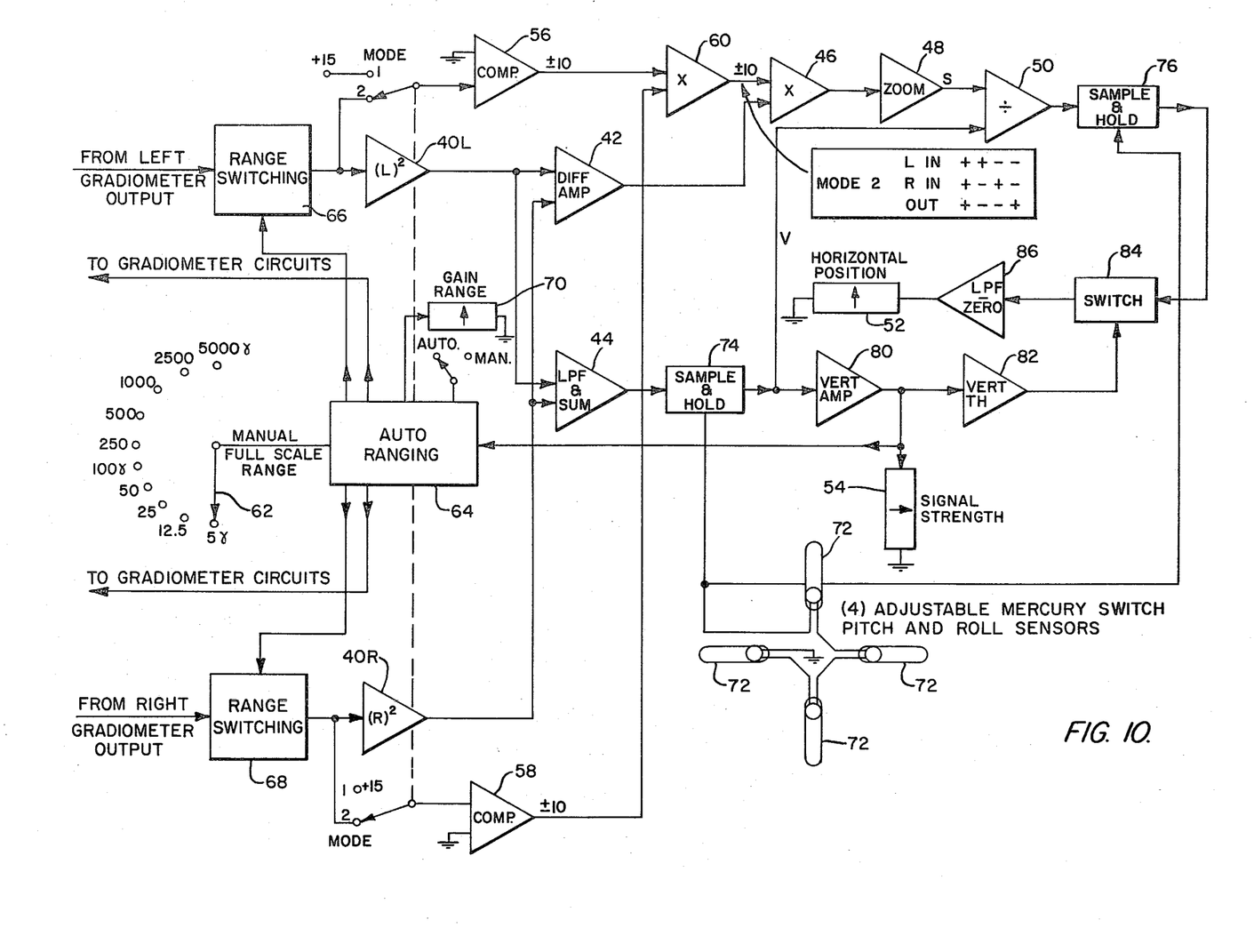
FIG. 10 is a block diagram illustrating details of a signal processor and display which may be employed in the system of FIG. 7.

As shown in FIG. 10, gain ranging if each magnetometer pair can be manual or automatic. In the manual mode, a range is selected by a manual range switch 62 which adjusts automatic ranging circuit 64 to keep the signal strength indication of indicator 54 on scale. In the automatic mode, circuit 64 automatically sets amplifier gains so that the resultant signal strength will fall within the range of say 0.2 to 0.9 full scale. A signal of more than 0.9 full scale will cause the circuit to range up to the next higher range. A signal of less than 0.2 full scale will cause the circuit to range down to the next lower range. Range switching circuits 66 and 68 in the left and right gradiometer outputs are controlled by circuit 64, and outputs from circuit 64 to amplifiers in the gradiometer circuits for ranging purposes are also provided, as shown. A gain range indicator 70 may also be provided. The ranging circuits per se may be conventional.

When the gradiometers are supported on a boat or other vessel subject to attitude change, pitch or roll may produce signal errors. To minimize such errors, four position sensitive switches 72, such as mercury switches wired in series, are arranged as an adjustable tilt sensor in four quadrants. After a preset displacement in pitch or roll, of say 5 degrees, one of switches 72 opens, and since the switches are wired in series, a signal output (open circuit condition) is applied to sample and hold circuits 74 and 76, which sample the output of summing amplifier 44 and divider 50 and hold the displays on indicators 52 and 54 until pitch or roll has been restored within the preset limits.

An adjustable signal strength threshhold may be employed for horizontal position indication, so that indicator 52 is only energized when the threshhold is reached. For this purpose, the output of sample and hold circuit 74 is applied through a vertical signal amplifier 80 to a vertical threshhold setting amplifier 82 (a comparator), which controls a switch 84 in the path by which signal H is applied to indicator 52. When the threshhold set by amplifier 82 is reached, switch 84 closes, allowing display of the horizontal position data.

In display mode 2, the $\Delta Z$ left and $\Delta Z$ right inputs are compared with 0 volts in analog comparators 56 and 58 to determine their polarity, as described earlier. In mode 2 the outputs of comparator 60 may be $+10$ volts or $-10$ volts, for example, depending on the polarity of the $\Delta Z$ inputs. In mode 1 the output of comparators 56 and 58 is always $+10$ volts. In mode 2, when $\Delta Z$ left and $\Delta Z$ right are both positive, the output of multiplier 60 will be $+10$ volts. When one $\Delta Z$ output is positive and one $\Delta Z$ output is negative, the output of multiplier 50 will be $-10$ volts. When both $\Delta Z$ outputs are negative, the output of multiplier 60 will be $+10$ volts. Zoom amplifier 48 is a variable gain amplifier, controlled at the front panel of the apparatus, which provides a zoom or close examination of the horizontal position display.

Amplifier 86 provides an adjustable zero center of meter 52. Low pass filters may be employed in amplifiers 44 and 86 to minimize rapid fluctuation in signal.

Figure 11:
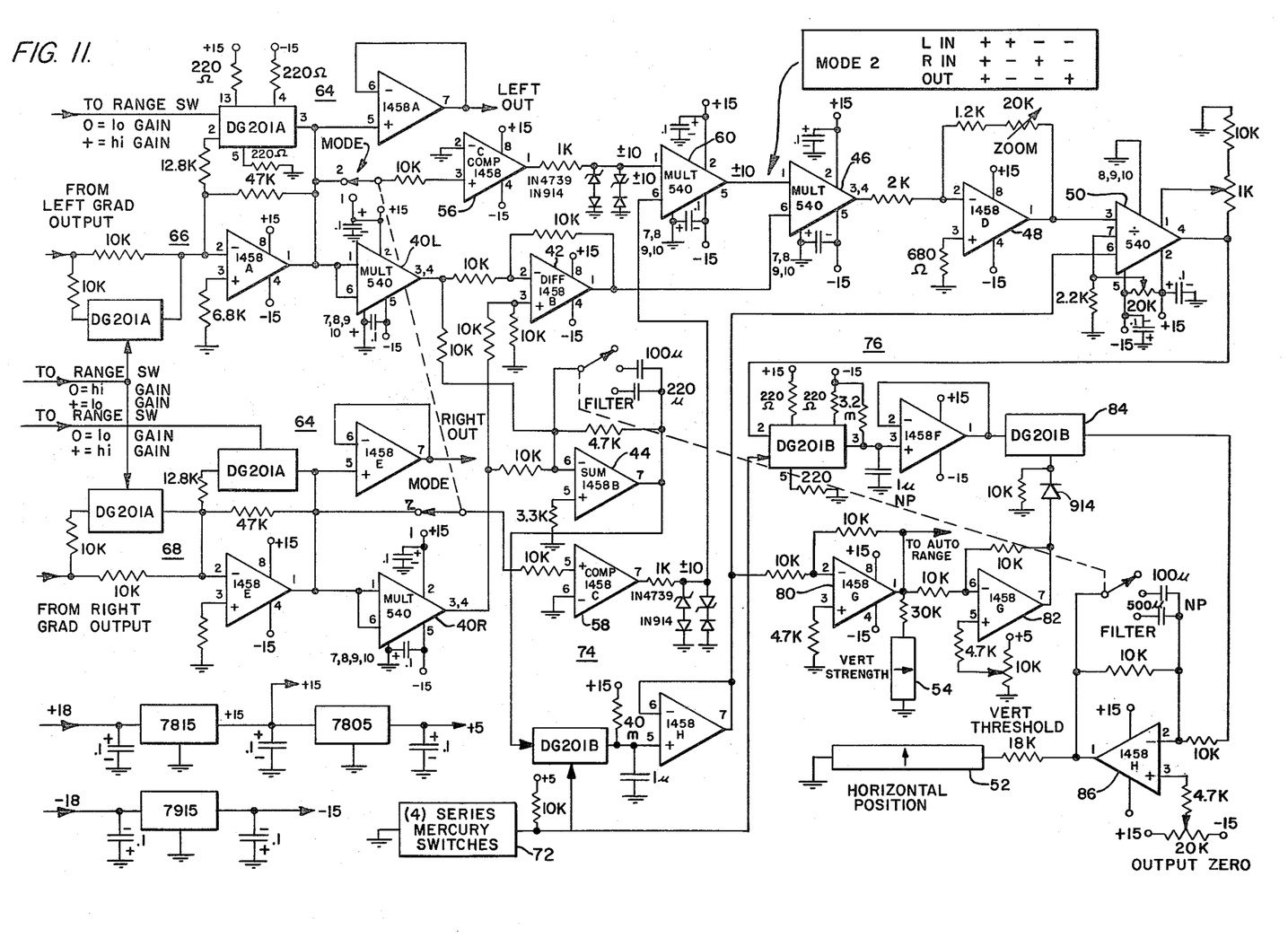
FIG. 11 is a detailed schematic diagram of an electrical system such as that illustrated in FIG. 7.

FIG. 11 is a schematic diagram of signal processor and display portions of an electrical system such as that illustrated in FIG. 7, showing representative component types and values. This circuit diagram is supplied merely for completeness of illustration of the best mode, and detailed description of the diagram would be superfluous.

As stated earlier, vertical coordinate information may be obtained, in addition to horizontal coordinate information, by employing signals from two pairs of gradiometers, arranged as in FIG. 3 or 4, for example. As shown in FIG. 7A, the V signal from an inner or upper pair, $V_{1, 2}$, may be divided by the V signal from an outer or lower pair, $V_{3, 4}$ to obtain a ratio signal that varies with height above the magnetic object and that may be displayed to indicate vertical coordinate information.

An illustrative use of the invention is shown diagrammatically in FIG. 5. As the object O is approached from a distance, the first indication of the object will be a small deflection on meter 54 (V) accompanied by a deflection on meter 52 (H) of about ¾ of full deflection. Weak magnetic fields manifested at a substantial distance from the magnetic object may not follow the patterns shown in FIGS. 6A and 6B, but as the object is approached and field sensing exceeds the noise level (where the field strength reaches about one-tenth the maximum value) the gradiometers start to operate in a meaningful manner. As the distance between the vehicle and the object decreases further, V increases, but H remains at about ¾ full deflection until a point is reached at which the horizontal displacement of the vehicle from the object is approximately equal to the vertical displacement. H then increases to full deflection (H=1) as V continues to increase. When the vehicle is over the object, V is a maximum and H is zero. Determination of the proper selection of the operating mode (mode 1 or mode 2) has been described previously. Once the determination has been made, locating and tracking may be accomplished irrespective of whether the gradient is symmetric or anti-symmetric. Locating and tracking are independent of the magnetic signature of the object. Moreover, the invention works for AC fields as well as DC fields. For use with AC fields, a filter may be provided that filters out a particular frequency for signal processing in accordance with the invention, thereby discriminating against DC interference.

Figure 12:
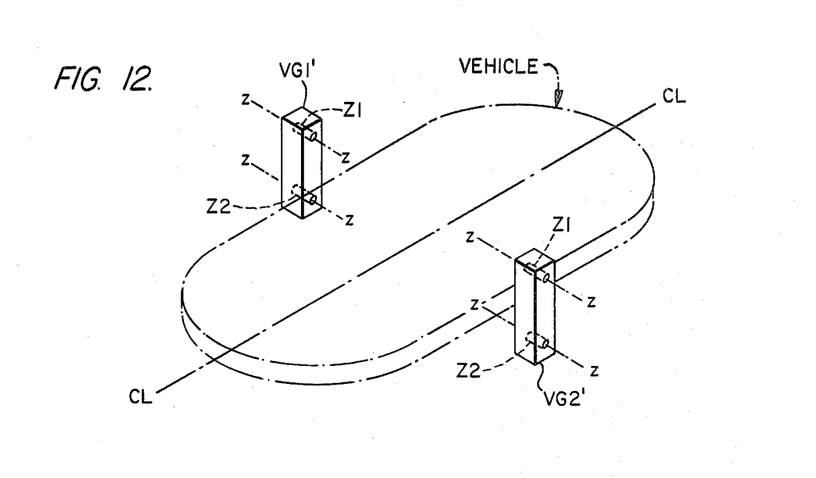
FIG. 12 is a diagrammatic isometric view of a fifth embodiment.

FIG. 12 illustrates a preferred arrangement of the invention for tracking a linear object carrying AC current. As shown, the fluxgate sensor axes z—z of each gradiometer VG1' and VG2' are arranged parallel but not collinear. The sensors Z1 and Z2 of each gradiometer are stacked one above the other, and the sensors are oriented horizontally transverse to the vehicle center line CL. The outputs of the fluxgate sensors of each gradiometer may be applied to a difference circuit (not shown) arranged to measure the amplitude of the AC field at a preselected frequency f to determine the difference or gradient in the AC magnetic component at that frequency. (The outputs of the fluxgate sensors at frequency f may be treated identically to the DC magnetic field components measured by the embodiments of FIGS. 1-4 using the previously described apparatus.)

With the sensors so arranged, the invention is able to track any linear object carrying an AC current at frequency f in the symmetric tracking mode to develope signals $$S = |L|^n - |R|^n$$

$$V = |L|^n + |R|^n$$

$$H = S/V$$

where L and R refer to the AC component gradient measured by the left and right gradiometers, as previously described.

A second pair of gradiometers may also be employed, if desired, arranged outboard of gradiometers VG1' and VG2' (similar to the arrangement of the embodiment of FIG. 3) or stacked vertically with respect to gradiometers VG1' and VG2' (similar to the embodiment of FIG. 4 but with the gradiometers rotated 90° so that their longitudinal axes are vertical) in order to provide vertical displacement information or depth using the ratios $V_{outer}/V_{inner}$ or $V_{upper}/V_{lower}$, as previously described.

The embodiment of FIG. 12 is useful for determining information about an AC current carrying linear object, such as a conductor, pipe or cable. By impressing an AC current onto the linear object, the invention may be used to detect changes, interruptions, or terminations of the current path in the linear object by detecting rapid variations in V which accompany, for example, leakage of current from the linear object to ground. Accordingly, the invention is useful for detecting points of electrical contact between ground and a linear object that is buried in the earth or submerged in seawater, and can reveal joints and pipe coating damage or other such defects. Moreover, since filters may be employed for selecting particular frequencies for signal processing, the invention may be used to track an object carrying current of a particular frequency that is in close proximity to other such objects carrying different frequency currents, and may be used to track non-magnetic or weakly magnetized objects in the presence of large DC magnetic fields. For example, the invention is useful for tracking flexible stainless steel flow lines beneath offshore oil platforms to detect defects in the lines, as will now be described.

Figure 13:
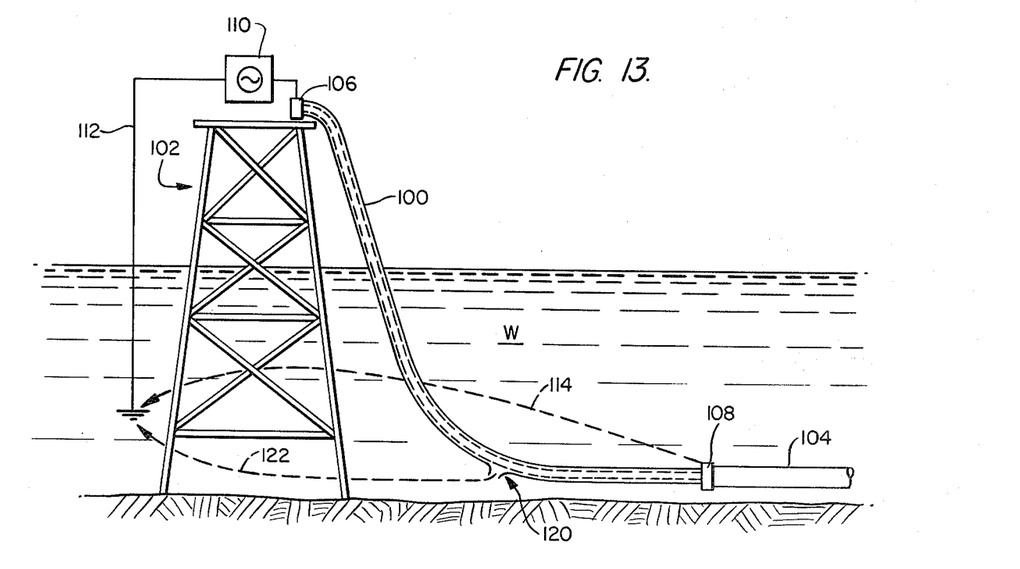
FIG. 13 is a diagrammatic view illustrating an environment in which the invention is useful.

As shown in FIG. 13, an electrically insulated flexible stainless steel flow line 100, such as Coflexip, is generally used to interconnect an offshore oil platform 102 to a submerged pipeline 104. The flexible line 100 is electrically isolated by an outer insulation from the seawater W except at its ends, one end 106 being on the platform above the waterline and the other end 108 being at its connection to the pipeline. An AC current source 110 may be connected to the platform end 106 and a ground wire 112 may be dropped into the seawater to provide a seawater return current path 114 between end 108 and the ground wire. AC source 110 is used to impress a predetermined frequency f onto the flow line to enable it to be tracked, and end 108 may be readily detected by observing rapid variations in V resulting from the "leakage" current path 114 between end 108 and ground wire 112 as the vehicle passes over the end 108. Moreover, if there is any break or damage to the flow line insulation, as shown at 120, an additional current return path 122 will exist, and the defect can be detected by detecting a drop in the total current carried by the line beyond the damaged point.

The invention may also be used for checking current paths to anodes in induced (active) cathodic protection systems for offshore oil platforms and the like. In such systems, a DC potential is used to drive currents from the seawater into the platform or the structure being protected. The potential is applied between the platform and an array of cathodes positioned in a specific pattern on the seafloor, and currents flow to the platform in a prearranged pattern designed to provide maximum cathodic protection. Disruption of the current pattern due to breaks in wires or insulation may result in a change in the level of cathodic protection. By impressing an AC component onto the DC cathode protection current, disruption of the current pattern may be readily detected using the invention.

A further use of the invention is the tracking of objects, such as pigs, inside of pipelines. The pigs can be configured to include an AC current source having a frequency f for producing an AC field. A magnet rotating at frequency f may be used, or a solenoid having its axis parallel to the pipe axis and driven by the AC source may be used for producing the AC field. A preferred embodiment of the invention for pig tracking is to employ vertical, collinear sensors with the gradiometer axes vertical. With the sensor axes vertical, the invention may separately and simultaneously track both the pipe (using its DC field) and the pig (using the AC field).

While several preferred embodiments of the invention have been shown and described, it will be apparent to those skilled in the art that changes can be made in these embodiments without departing from the principles and spirit of the invention, the scope of which is defined in the appended claims.

We claim:

1. Magnetic locating apparatus comprising a pair of spaced gradiometers for producing output signals dependent upon the gradient of a magnetic field associated with a magnetic object to be located, means supporting the gradiometers for movement relative to the magnetic object to be located, and means responsive to the output signals for indicating the location of the magnetic object relative to the gradiometers along a coordinate axis irrespective of the magnetic field signature of the object.

2. Apparatus in accordance with claim 1, wherein the magnetic axes of the gradiometers are substantially parallel.

3. Apparatus in accordance with claim 2, further comprising a second pair of gradiometers spaced on the supporting means orthogonally to the first-mentioned pair and having substantially parallel magnetic axes, the second pair of gradiometers producing further output signals dependent upon the gradient of the magnetic field associated with the magnetic object for indicating the position of the magnetic object relative to the second pair of gradiometers along another coordinate axis.

4. Magnetic locating apparatus comprising first and second pairs of spaced gradiometers for producing first and second output signals, respectively, dependent upon the gradient of a magnetic field associated with a magnetic object to be located, means supporting the gradiometers for movement relative to the magnetic object and such that the magnetic axes of the gradiometers of each pair are substantially parallel and such that each of the gradiometers of the second pair is located laterally relative to a corresponding gradiometer of the first pair, and means responsive to the first and second output signals from the first and second pairs of gradiometers for indicating the position of the magnetic object relative to the gradiometers along first and second coordinate axes irrespective of the magnetic field signature of the object.

5. Magnetic locating apparatus comprising first and second pairs of spaced gradiometers for producing first and second output signals, respectively, dependent upon the gradient of a magnetic field associated with a magnetic object to be located, means supporting the gradiometers for movement relative to the magnetic object and such that the magnetic axes of the gradiometers of each pair are substantially parallel and such that the gradiometers of the second pair are located above or below the gradiometers of the first pair, and means responsive to the first and second output signals from the first and second pairs of gradiometers for indicating the position of the magnetic object relative to the gradiometers along first and second coordinate axes irrespective of the magnetic field signature of the object.

6. Magnetic locating apparatus comprising a pair of spaced gradiometers for producing output signals dependent upon the gradient of a magnetic field associated with a magnetic object to be located, each gradiometer having a pair of substantially aligned magnetic sensors and having temperature-corrected misalignment compensating means, means supporting the gradiometers for movement relative to the magnetic object to be located, and means responsive to the output signals for indicating the location of the magnetic object relative to the gradiometers along a coordinate axis irrespective of the magnetic field signature of the object.

7. Apparatus in accordance with claim 6, wherein the misalignment compensating means comprises electrical compensating means.

8. Apparatus in accordance with claim 7, wherein the compensating means comprises means for applying a compensating magnetic field to each gradiometer.

9. Apparatus in accordance with claim 7, wherein the compensating means comprises means for producing a pair of component signals dependent upon gradiometer sensor misalignment along two orthogonal axes at a predetermined temperature, means for producing a signal that varies with the temperature of the sensors, means for separately multiplying the last-mentioned signal by each of the component signals to produce a pair of product signals, and means for summing the product signals and producing a misalignment compensating signal.

10. Apparatus in accordance with claim 9, further comprising means for producing a signal compensating for magnetic gradients to be nulled, and means for supplying the last-mentioned signal to the summing means for summing with the product signals.

11. Apparatus in accordance with claim 10, wherein the means for producing the compensating signal comprises a digital-to-analog converter having a digital input thereto that is set to produce a corresponding analog compensating signal.

12. Apparatus in accordance with claim 7, wherein the compensating means comprises means for producing a DC voltage which varies in a predetermined manner with temperature so as to correct temperature-dependent errors in a misalignment compensating voltage.

13. Magnetic locating apparatus comprising a pair of spaced gradiometers for producing output signals dependent upon the gradient of a magnetic field associated with a magnetic object to be located, means supporting the gradiometers for movement relative to the magnetic object to be located, and means responsive to the output signals comprising signal processing means having a pair of selectable operating modes, one of which is selected when the magnetic field associated with the object is principally symmetric and the other of which is selected when the magnetic field associated with the object is principally anti-symmetric, for indicating the location of the magnetic object relative to the gradiometers along a coordinate axis irrespective of the magnetic field signature of the object.

14. Magnetic locating apparatus comprising a pair of spaced gradiometers for producing output signals dependent upon the gradient of a magnetic field associated with a magnetic object to be located, means supporting the gradiometers for movement relative to the magnetic object to be located, and means responsive to the output signals for indicating the location of the magnetic object relative to the gradiometers along a coordinate axis irrespective of the magnetic field signature of the object, wherein the means responsive to the output signals from the gradiometers produces a first signal, S, related to output signals L and R of the gradiometers, respectively, in accordance with one of the relationships:

$$S = |L|^n - |R|^n \quad \text{and}$$

$$S = \text{sign}(L)\,\text{sign}(R)\,[|L|^n - |R|^n],$$

a second signal, V, related to L and R in accordance with the relationship $V=|L|^n+|R|^n$, and produces a third signal, H, where $H=S/V$ and $n\geq 0$.

15. Apparatus in accordance with claim 14, further comprising means for preventing indication of signal H until signal S reaches a predetermined threshhold value.

16. Apparatus in accordance with claim 14, further comprising sample and hold means responsive to the attitude of the supporting means for sampling and holding the signals V and H when a coordinate of the attitude of the supporting means exceeds a predetermined value.

17. Apparatus in accordance with claim 14, wherein n=2.

18. Apparatus in accordance with claim 14, wherein the means responsive to said output signals comprises means for selectively producing a signal $$S=|L|^n-|R|^n \text{ or } S=\text{sign}(L)\text{ sign}(R)$$
$$[|L|^n-|R|^n].$$

19. A method of locating a magnetic object which comprises providing a pair of gradiometers having substantially parallel magnetic axes, producing output signals L and R from the gradiometers in response to a magnetic field associated with the object, producing a signal $V=|L|^n+|R|^n$, producing a signal $S=|L|^n-|R|^n$ or sign (L) sign (R) $[|L|^n-|R|^n]$ depending upon whether the magnetic field associated with the object is symmetric or antisymmetric, producing a signal $H=S/V$, and indicating, as a function of H, the position of the gradiometers relative to the object along a coordinate axis.

20. A method in accordance with claim 19, wherein the form of the signal S produced is selected by observing whether V has a single maximum or dual maxima as the pair of gradiometers moves past the magnetic object.

21. A method in accordance with claim 20, wherein the correctness of the selection of the form of the signal S is determined by observing if motion of the gradiometers in the direction indicated by H results in decrease in H for small H.

22. A method of locating a magnetic object which comprises providing a pair of gradiometers at spaced locations on a vehicle for producing output signals dependent upon the gradient of a magnetic field associated with the magnetic object, processing said output signals to produce an indication of the direction of the magnetic object from the vehicle along a coordinate axis, moving the vehicle in the direction indicated to approach the object, and controlling the processing so that the direction of the object relative to the vehicle is indicated irrespective of whether the magnetic field associated with the object is predominantly symmetric or anti-symmetric.

23. A method in accordance with claim 22, wherein the controlling comprises moving the vehicle past the object and observing the output signals from the gradiometers.

24. A method in accordance with claim 22, wherein the controlling comprises selecting a first form of signal processing if the observing shows that the magnetic field is symmetric and selecting a second form of signal processing if the observing shows that the magnetic field is anti-symmetric.

25. A method in accordance with claim 22, further comprising providing a second pair of gradiometers at spaced locations on the vehicle, producing further output signals from the second pair, and processing the further output signals to provide an indication of the location of the outlet relative to the vehicle along another coordinate axis.

26. A method in accordance with claim 25, wherein the signal processing produces an indication of the location of the object relative to the vehicle along orthogonal horizontal coordinate axes.

27. A method in accordance with claim 25, wherein the signal processing produces an indication of the location of the object relative to the vehicle along horizontal and vertical coordinate axes.

28. A method in accordance with claim 22, wherein the magnetic object is a linear object and the vehicle is moved along the object so as to maintain a predetermined indication from the signal processing.

29. Magnetic locating apparatus comprising a pair of spaced gradiometers for producing output signals dependent upon the gradient of a magnetic field associated with an object carrying AC current of a predetermined frequency, means supporting the gradiometers for movement relative to the object, means for deriving output signals of said predetermined frequency from the gradiometers, and means responsive to the signals derived by the deriving means for indicating the location of the object relative to the gradiometers along a coordinate axis.

30. Apparatus in accordance with claim 29, wherein each gradiometer comprises a pair of sensors having parallel non-collinear axes.

31. Apparatus in accordance with claim 29, further comprising another pair of gradiometers spaced from the gradiometers of the first-mentioned pair for producing other output signals dependent on the gradient of the magnetic field, and wherein the indicating means is responsive to the other output signals of said predetermined frequency for indicating the direction of the object relative to the gradiometers along another coordinate axis.

32. Apparatus in accordance with claim 29, wherein the output signals from the gradiometers comprise a first signal $S=|L|^n-|R|^n$, a second signal $V=|L|^n+|R|^n$, and a third signal $H=S/V$, where L and R refer to the AC component gradient measured by respective gradiometers of the pair.

33. Apparatus in accordance with claim 29, wherein the object is a linear object, and wherein the apparatus comprises means for detecting rapid variations in the output signals to indicate changes, interruptions, or terminations of the current path in the linear object.

34. Apparatus in accordance with claim 29, wherein said object is in proximity to other objects having associated therewith DC magnetic fields or AC magnetic fields of frequencies other than said predetermined frequency, and wherein said deriving means comprises means for deriving said signals of said predetermined frequency to the exclusion of other signals in order to enable said object to be distinguished from the other objects and to be tracked.

35. Magnetic locating apparatus comprising a pair of spaced gradiometers for producing output signals dependent upon the gradient of a DC magnetic field associated with a linear object and the gradient of an AC magnetic field associated with an AC source of a predetermined frequency that moves along the linear object, and signal processing means for seperately processing output signals dependent upon the gradient of the DC magnetic field and output signals dependent upon the gradient of the AC magnetic field to enable simultaneous tracking of both the linear object and the AC source.

36. Apparatus in accordance with claim 34, wherein each gradiometer comprises a pair of sensors having collinear sensor axes oriented orthogonal to the direction of the linear object.

* * * * *